United States Patent
Hikichi (10) Patent No.: US 11,841,247 B2
(45) Date of Patent: Dec. 12, 2023

(54) SENSOR DEVICE (71) Applicant: ABLIC Inc., Tokyo (JP)

(72) Inventor: Tomoki Hikichi, Tokyo (JP)

(73) Assignee: ABLIC INC., Nagano (JP)

( * ) Notice: Subject to any disclaimer, the term of this patent is extended or adjusted under 35 U.S.C. 154(b) by 0 days.

(21) Appl. No.: 17/702,527

(22) Filed: Mar. 23, 2022

(65) Prior Publication Data
US 2022/0316920 A1    Oct. 6, 2022

(30) Foreign Application Priority Data
Mar. 30, 2021    (JP) .................. 2021-056349

(51) Int. Cl.
*G01D 4/14*    (2006.01)
*G01D 5/14*    (2006.01)

(52) U.S. Cl.
CPC .................. *G01D 5/147* (2013.01)

(58) Field of Classification Search
None
See application file for complete search history.

(56) References Cited

U.S. PATENT DOCUMENTS

| | | | | |
|---|---|---|---|---|
| 2012/0217955 A1* | 8/2012 | Petrie | ............... | G01R 33/07 |
| | | | | 324/207.2 |
| 2015/0084620 A1* | 3/2015 | Hikichi | ............... | G01R 33/0088 |
| | | | | 324/207.2 |
| 2018/0059193 A1 | 3/2018 | Hikichi et al. | | |

FOREIGN PATENT DOCUMENTS

| JP | H03-252526 A | 11/1991 |
|---|---|---|
| JP | 2018-036252 A | 3/2018 |

* cited by examiner

*Primary Examiner* — Patrick Assouad
*Assistant Examiner* — Haidong Zhang
(74) *Attorney, Agent, or Firm* — Crowell & Moring LLP (57) ABSTRACT

Provided is a sensor device provided with improved reproducibility of a switching characteristic and reduced average consumption current. A sensor device include: a sensor; a drive circuit configured to drive the sensor; a processing circuit configured to output a binary result signal obtained by binarizing an electrical signal output from the sensor; a determination circuit configured to capture the binary result signal a plurality of times and perform a predetermined logical determination processing; a latch circuit configured to capture an output signal of the determination circuit; an output terminal; and a control circuit configured to output a control signal for intermittently controlling at least one of the drive circuit and the processing circuit such that an operation period and a pause period are repeated with a predetermined cycle. The operation period is interrupted and caused to transition to the pause period in a predetermined case.

6 Claims, 6 Drawing Sheets

SENSOR DEVICE

RELATED APPLICATIONS

This application claims priority to Japanese Patent Application No. 2021-056349, filed on Mar. 30, 2021, the entire content of which is incorporated herein by reference.

BACKGROUND OF THE INVENTION

1. Field of the Invention

The present invention relates to a sensor device.

2. Description of the Related Art

A Hall element is used for various applications because the Hall element can detect a position and an angle in a non-contact manner as a magnetic sensor. One example of the applications of the Hall element is a magnetic switch. The magnetic switch includes, for example, a Hall element and a peripheral circuit including an amplifier or a comparator, and the Hall element and the peripheral circuit are integrally formed on a semiconductor chip. As a classification of the magnetic switch focused on a method for detecting magnetism, an omnipolar magnetic field detection type and a bipolar magnetic field detection type are known. In the omnipolar magnetic field detection type, magnetic fields of both an S-pole and an N-pole can be detected, and in the bipolar magnetic field detection type, an alternating magnetic field in which the S-pole and the N-pole are alternately changed over time can be detected.

Typically, noise represented by thermal noise occurs in a sensor element. In a case where reproducibility of an operation point and a return point (magnetoelectric conversion switching characteristics) is low due to noise and fluctuation is large, an amount to be detected represented by a detection position of a mechanism fluctuates. To reduce the fluctuation in the amount to be detected and increase a detection accuracy of the sensor element, there has been proposed a technique for reading a sensor output a plurality of times and performing determination processing (for example, see Japanese Patent Application Laid-Open No. H03(1991)-252526).

Furthermore, the sensor element generally requires a large amount of drive current in order to obtain a favorable signal-to-noise ratio (SNR) by improving sensitivity to increase a signal level and reducing the noise level described above. On the other hand, in a case where the sensor device is mounted on a battery-driven portable device, the sensor device is required to have reduced consumption current. As such, to reduce an average consumption current of the entire sensor device, there has been a widely used intermittent driving technique of alternately repeating a short operation period (an awake period) in which a detection operation is performed and a long pause period (a sleep period) in which only a timekeeper operation is performed (for example, see Japanese Patent Application Laid-Open No. 2018-036252).

However, in a case where a multi-time determination technique as described in Japanese Patent Application Laid-Open No. H03(1991)-252526 is combined with an intermittent driving technique as described in Japanese Patent Application Laid-Open No. 2018-036252, a longer operation period than that defined by (unit signal processing period)× (number of times of determination) is required. The longer the operation period, the greater a proportion of the operation period relative to the entire drive cycle, that is, a duty ratio, thereby reducing an effect of reducing the average consumption current.

In light of the above-described circumstances, an object of the present invention is to provide a sensor device with improved reproducibility of switching characteristics and reduced average consumption current by intermittent driving.

SUMMARY OF THE INVENTION

A sensor device according to an embodiment of the present invention includes: a sensor element configured to convert a predetermined physical amount into an electrical signal; a drive circuit configured to supply a drive signal to the sensor element; a processing circuit configured to output a binary result signal obtained by binarizing the electrical signal output from the sensor element; a determination circuit configured to capture the binary result signal a plurality of times and perform a predetermined logical determination processing; a latch circuit configured to capture a binary output signal of the determination circuit; and a control circuit configured to output a control signal for intermittently controlling at least one of the drive circuit or the processing circuit such that an operation period in which an operation current is supplied and a pause period in which the operation current is blocked are repeated with a predetermined cycle. The operation period is interrupted and caused to transition to the pause period in a case where the predetermined determination processing is performed in the operation period and an output logic of the determination circuit is determined to be not switched halfway through the operation period.

According to the embodiment of the present invention, it is possible to improve reproducibility of switching characteristics and reduce an average consumption current by intermittent driving.

DETAILED DESCRIPTION OF THE PREFERRED EMBODIMENTS

A sensor device according to an embodiment of the present invention will be described with reference to the accompanying drawings. The sensor device according to the present embodiment includes a magnetic switch provided on a semiconductor substrate. Note that, in the description, a conversion characteristic from a magnetic flux density acting on the semiconductor substrate into an analog signal will be referred to as a "magnetoelectric conversion characteristic" and a conversion characteristic from the magnetic flux density into a logic signal will be referred to as a "magnetoelectric conversion switching characteristic". In addition, "*" is used for representation as a multiplication symbol. For example, "A*VSIG" described below means a product of "A" and "VSIG".

Figure 1:
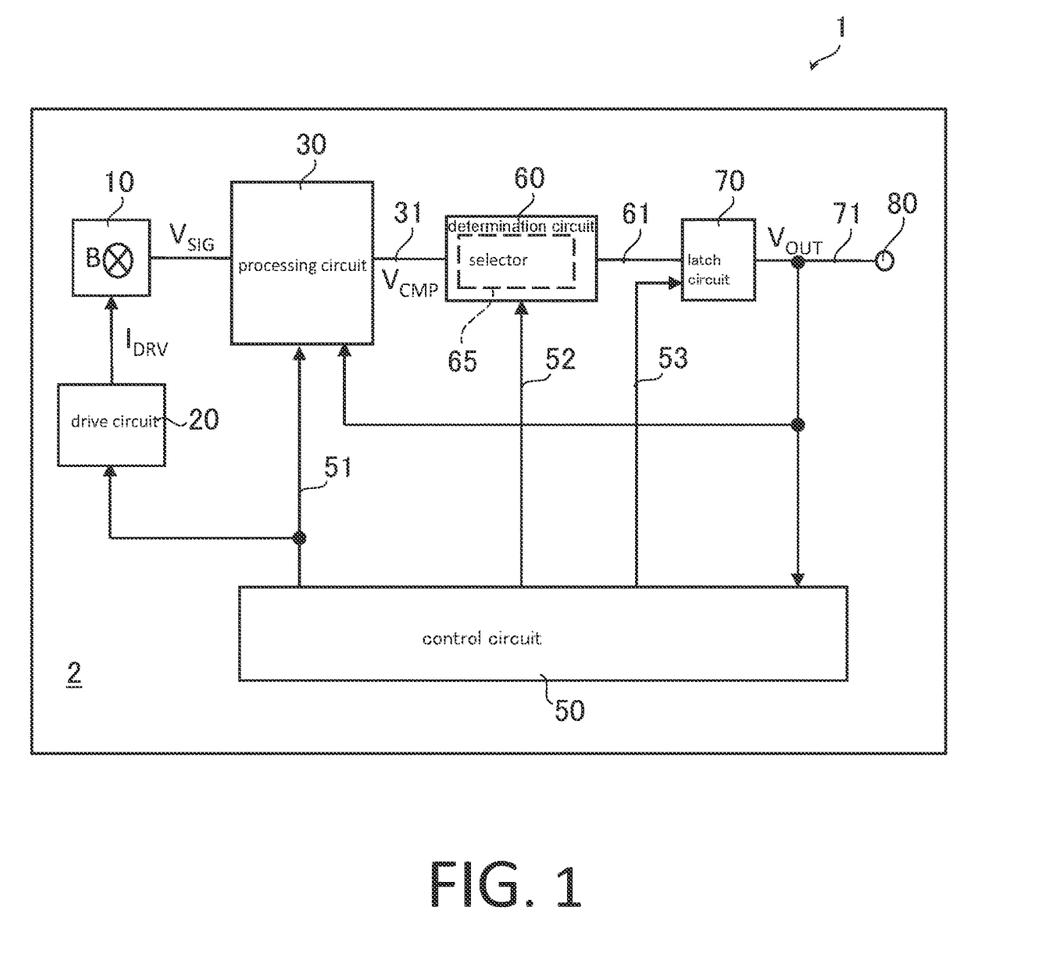
FIG. 1 is a block diagram of a sensor device according to an embodiment of the present invention.

FIG. 1 is a block diagram of a sensor device 1 serving as a sensor device according to an embodiment of the present invention. The sensor device 1 is provided on a semiconductor substrate 2. The sensor device 1 includes a Hall element 10, a drive circuit 20, a processing circuit 30, a control circuit 50, a determination circuit 60, a latch circuit 70, and an output terminal 80.

The Hall element 10 is a sensor element which can detect magnetism and outputs a Hall element output signal VSIG proportional to a Hall element drive current IDRV and a magnetic flux density (hereinafter, referred to as an "applied magnetic flux density") B applied perpendicularly to the semiconductor substrate 2, that is, a magnetic sensor element.

The drive circuit 20 is a circuit which supplies the Hall element drive current IDRV as a drive signal to the Hall element 10 as a sensor element. The drive circuit 20 is configured to perform on/off control of the Hall element drive current IDRV for driving the Hall element 10 in accordance with a logical value of a drive control signal 51 input thereto. Here, a state in which the Hall element drive current IDRV is supplied, i.e., an on state, will be referred to as an "operation state of the drive circuit 20". A state in which the Hall element drive current IDRV is not supplied, i.e., an off state, will be referred to as a "pause state of the drive circuit 20".

The processing circuit 30 is configured in such a manner that a state thereof switches between the operation state and the pause state in accordance with the logical value of the drive control signal 51 input thereto. The processing circuit 30 includes, for example, an amplifier which amplifies the Hall element output signal VSIG as an input electrical signal, and a comparator which outputs a binary result signal 31 in accordance with a magnitude relationship between the amplified Hall element output signal VSIG and a reference voltage.

In the operation state, the processing circuit 30 is configured to determine a magnitude of the applied magnetic flux density B by amplifying the input Hall element output signal VSIG by an amplification rate of A (A>0) times and comparing the amplified signal with a predetermined reference voltage and output the binary result signal 31 indicating a determination result. The predetermined reference voltage is configured to be switched to any one of two reference voltages different from each other, i.e., a first reference voltage or a second reference voltage (not equal to the first reference voltage) in accordance with an output logic signal 71 and have so-called hysteresis characteristics. In addition, in the pause state, the processing circuit 30 is configured such that an operation current required for the amplification and comparison operation is blocked to reduce current consumption, and is configured to output the binary result signal 31 of a low level (VCMP="L") regardless of the magnitude of the applied magnetic flux density B.

In accordance with the logical value of the output logic signal 71 output from the latch circuit 70, the control circuit 50 is configured to output a drive control signal 51 as a control signal to switch the drive circuit 20 and the processing circuit 30 to the operation state or the pause state, and output a register clock signal 52 for the determination circuit 60 to capture the binary result signal 31 a plurality of time during the operation period and a latch clock signal 53 for the latch circuit 70 to capture a determination result signal 61 indicating a result of multi-time determination at the time of transition from the operation period to the pause period.

The determination circuit 60 is configured to capture the binary result signal 31 as serial data in synchronization with the register clock signal 52, perform a predetermined multi-time determination processing, and output the determination result signal 61 as a binary output signal indicating a result of the multi-time determination processing. In the present embodiment, as the predetermined multi-time determination processing, an all-time match determination processing is used. The all-time match determination processing described below is an example in which the binary result signal 31 is captured four or more times, and in a case where the determination result matches up four consecutive times, transition occurs between a detection state and a release state.

The latch circuit 70 is configured to latch the determination result signal 61 in synchronization with the latch clock signal 53 to output a voltage VOUT which is the output logic signal 71. The voltage VOUT is supplied to the output terminal 80 and supplied (fed back) to the processing circuit 30 and the control circuit 50.

Next, the magnetoelectric conversion characteristics of the sensor device 1 according to the embodiment of the present invention will be described with reference to the drawings.

Figure 2A:
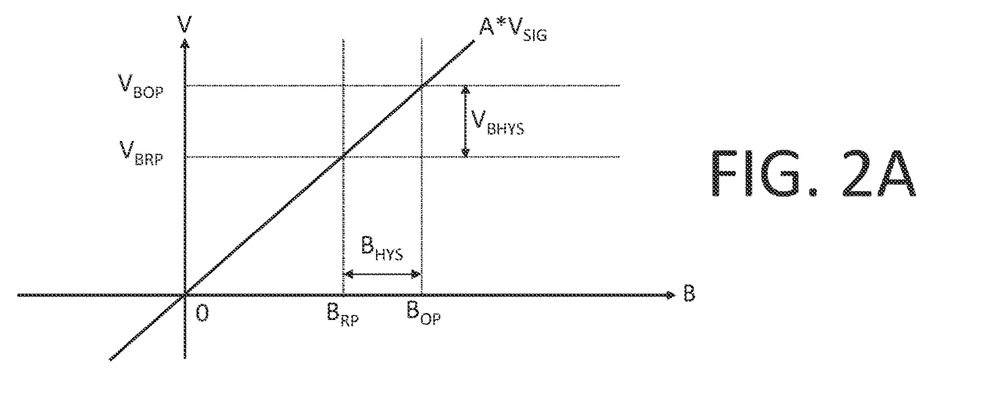
FIG. 2A is a relationship diagram illustrating a relationship of an amplification signal and a comparison reference voltage relative to an applied magnetic flux density in the sensor device according to the embodiment.

FIG. 2A is a relationship diagram illustrating a relationship of an amplification signal (A*VSIG) in the processing circuit 30, a comparison reference voltage VBOP, and a comparison reference voltage VBRP relative to the applied magnetic flux density B.

The amplification signal (A*VSIG) has a proportional relationship with respect to the applied magnetic flux density B. Here, the applied magnetic flux density B serving as the operation point in the magnetoelectric conversion characteristics is defined as an operation point BOP, and the applied magnetic flux density B serving as a return point in the magnetoelectric conversion characteristics is defined as a return point BRP. In this case, the amplification signal (A*VSIG) at the operation point BOP has the comparison reference voltage VBOP and the amplification signal (A*VSIG) at the return point BRP has the comparison reference voltage VBRP. A difference between the operation point BOP and the return point BRP is a hysteresis width BHYS, and a difference between the comparison reference voltage VBOP and the comparison reference voltage VBRP is a comparison reference hysteresis voltage VBHYS.

Figure 2B:
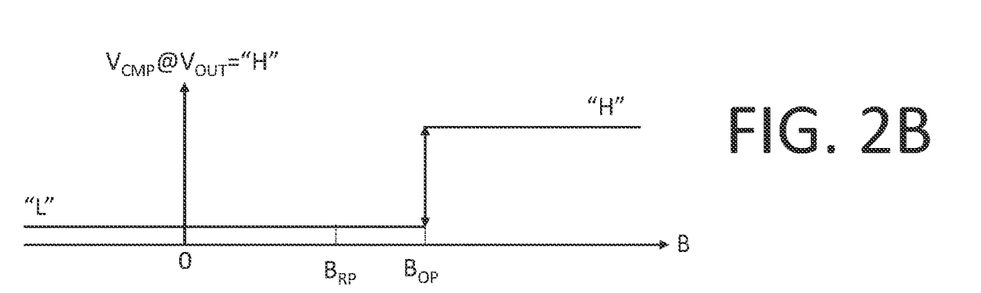
FIG. 2B is a relationship diagram illustrating an output voltage of a processing circuit relative to the applied magnetic flux density in the sensor device according to the embodiment in a case of VOUT="H".

FIG. 2B is a relationship diagram illustrating a voltage VCMP output from the processing circuit 30 relative to the applied magnetic flux density B in the sensor device 1 in a case of VOUT="H". In a case where the applied magnetic flux density B is less than BOP (B<BOP), the voltage VCMP is a low level (VCMP="L"), and in a case of B>BOP, the voltage VCMP becomes a high level (VCMP="H"). This magnetoelectric conversion characteristic itself has a threshold of only one operation point BOP, and has no hysteresis characteristic.

Figure 2C:
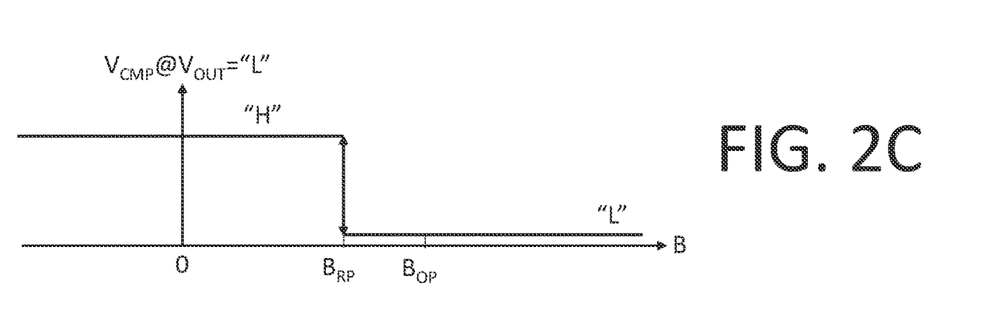
FIG. 2C is a relationship diagram illustrating the output voltage of the processing circuit relative to the applied magnetic flux density in the sensor device according to the embodiment in a case of VOUT="L".

FIG. 2C is a relationship diagram illustrating the voltage VCMP output from the processing circuit 30 relative to the applied magnetic flux density B in the sensor device 1 in a case of VOUT="L". In a case where the applied magnetic flux density B is less than BRP (B<BRP), the voltage VCMP is a high level (VCMP="H"), and in a case of B>BRP, the voltage VCMP becomes a low level (VCMP="L"). FIG. 2C is different from FIG. 2B in that the threshold is not the operation point BOP but the return point BRP and the logic of the voltage VCMP corresponding to the magnitude relationship with the threshold is reversed. Similarly to FIG. 2B, the magnetoelectric conversion characteristic itself has a threshold of only one return point BRP, and has no hysteresis characteristic.

Figure 2D:
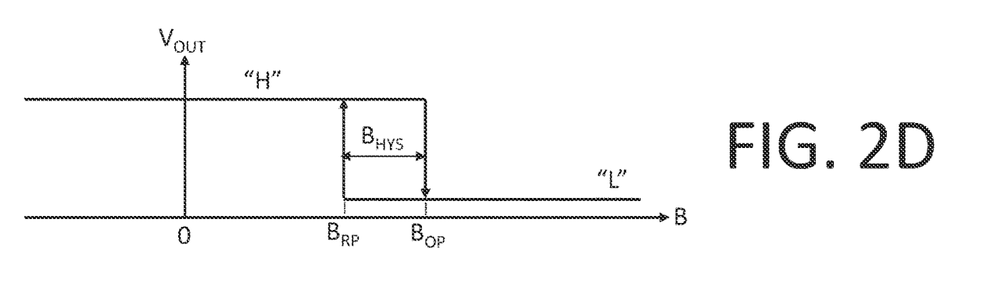
FIG. 2D is a relationship diagram illustrating an output voltage of a latch circuit relative to the applied magnetic flux density in the sensor device according to the embodiment.

FIG. 2D is a relationship diagram illustrating the voltage VOUT output from the latch circuit 70 relative to the applied magnetic flux density B in the sensor device 1. A magnetoelectric conversion characteristic in FIG. 2D has a hysteresis characteristic having two thresholds in which a threshold for transition from "H" to "L" is the operation point BOP and a threshold for transition from "L" to "H" is the return point BRP.

Next, an operation of the sensor device 1 will be described, specifying a signal voltage of each portion for the applied magnetic flux density B.

Subsequently, an operation in a case of transition from a strong magnetic field to a weak magnetic field after transition from the weak magnetic field to the strong magnetic field in the sensor device 1 will be described.

An instantaneous consumption current IDD becomes a predetermined operation current IDDA during the operation period and becomes a predetermined pause current IDD0 during the pause period. In the pause period, only a minimum function such as a reference clock circuit (not illustrated) inside the control circuit 50 operates, and the pause current is kept low. An operation period TAW and a pause period TSL are specified, so that a drive cycle TCYC which is a sum of the operation period and the pause period is specified. The drive cycle TCYC is fixed to a constant value, and the sum of the operation period TAW and the pause period TSL is the drive cycle TCYC.

Figure 3:
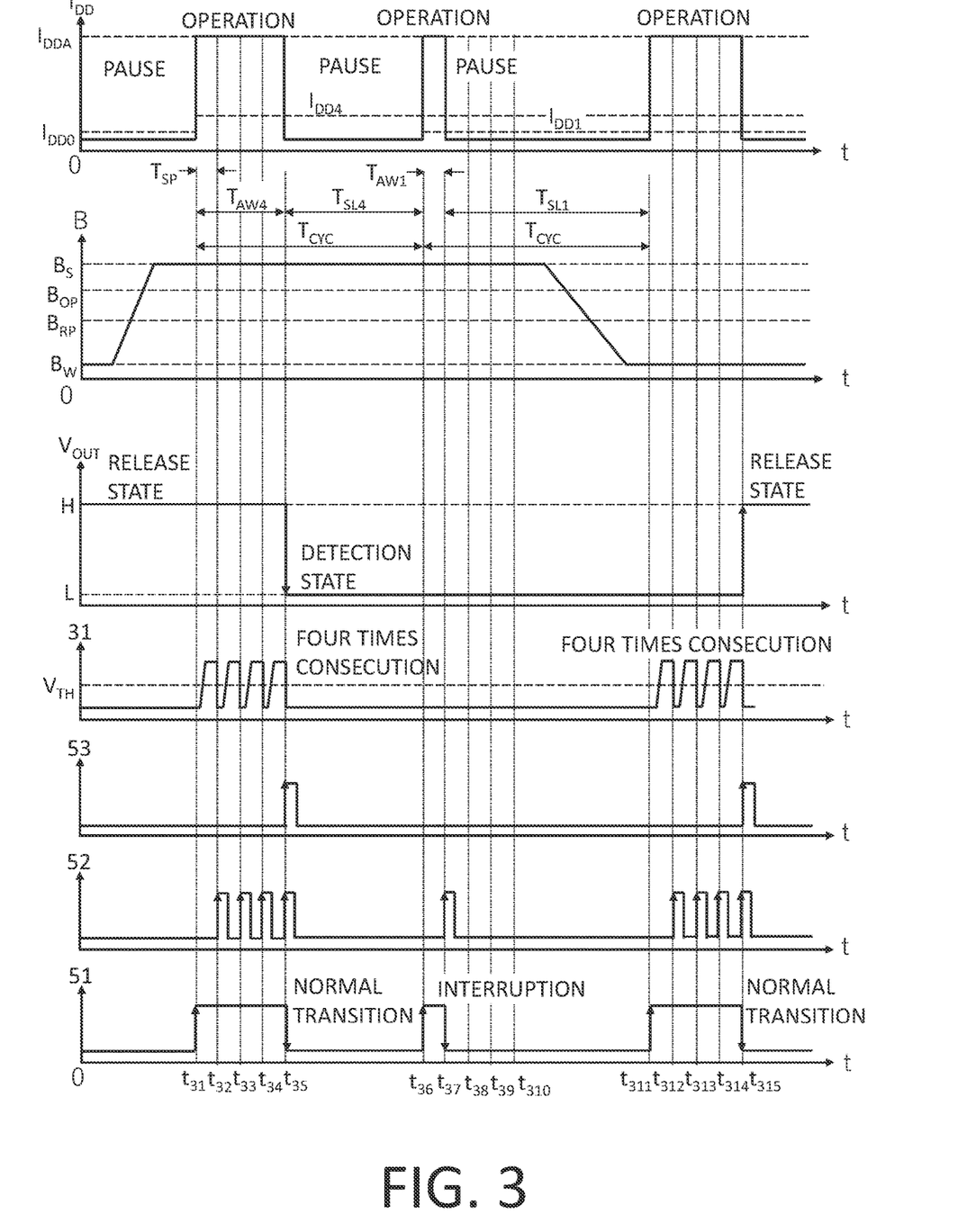
FIG. 3 is a timing chart in a case where a magnetic field transitions in an order of a weak magnetic field, a strong magnetic field, and a weak magnetic field in the sensor device according to the embodiment.

FIG. 3 is a timing chart in a case where a magnetic field transitions in an order of a weak magnetic field, a strong magnetic field, and a weak magnetic field in the sensor device 1. The operation period TAW is specified by natural number times a predetermined processing period TSP. In the present embodiment, an operation period TAWn may take a period from TSP to 4*TSP. That is, it is expressed by Equation (1) below.

$$TAWn = n*TSP (n=1,2,3,4) \qquad (1)$$

An average consumption current of one cycle in a case where the operation period TAWn is expressed by each period is expressed by Equation (2) below.

$$IDDn = IDD0 + IDDA*nTSP/TCYC (n=1,2,3,4) \qquad (2)$$

At this time, each pause period TSLn is expressed by Equation (3) below.

$$\begin{aligned} TSLn &= TCYC - TAWn \\ &= TCYC - n*TSP \ (n=1,2,3,4) \end{aligned} \qquad (3)$$

At time t=0, the drive control signal 51 is "L", and the sensor device 1 is in the pause state. In addition, the applied magnetic flux density B is in a region satisfying B=Bw<<BRP, and VOUT is a high level (VOUT="H"), that is, the applied magnetic flux density B is the weak magnetic field Bw. The binary result signal 31 is forcibly fixed to "L" because the sensor device 1 is in the pause state.

At time t=t31, the drive control signal 51 transitions from "L" to "H", and the sensor device 1 transitions from the pause state to the operation state. The applied magnetic flux density B increases over the operation point BOP and is greater than BOP (B>BOP), the binary result signal 31 becomes "H" for the first time at time t=t32, the binary result signal 31 becomes "H" for the second time at time t=t33, the binary result signal 31 becomes "H" for the third time at time t=t34, and the binary result signal 31 becomes "H" for the fourth time at time t=t35. As long as the binary result signal 31 continues to be "H" in this manner, the operation state is continued up to a predetermined maximum number of times. The predetermined maximum number of times is set to greater than or equal to the required number of times of match, in the relationship with the all-time match determination processing.

The binary result signals 31 for the first to fourth times are "H", and thus the determination result signal 61 becomes "L" and is latched by the latch circuit 70 in response to a rising edge of the latch clock signal 53 at time t=t35, so that VOUT becomes a low level (VOUT="L"), that is, the sensor device 1 transitions to a detection state indicating that a strong magnetic field Bs (>>BOP) is detected, and at the same time, the drive control signal 51 transitions to "L", whereby the sensor device 1 transitions from the operation state to the pause state.

Subsequently, the pause state is continued until immediately before time t=t36, and the applied magnetic flux density B remains greater than BOP (B>BOP). At time t=t36, the drive control signal 51 transitions to "H" again, and the sensor device 1 becomes in the operation state. Here, because the binary result signal 31 for the first time is "L", at time t=t37, the drive control signal 51 transitions to "L", and the sensor device 1 immediately transitions to the pause state. For a period from time t=t37 to time t=t310, the sensor device 1 operates as the pause state in which the operation state is discontinued.

Subsequently, the pause state is continued until immediately before time t=t311, and for a period from time t=t310 to time t=t311, the applied magnetic flux density B decreases from the strong magnetic field Bs and becomes the weak magnetic field Bw (<<BRP). At time t=t311, the drive control signal 51 transitions to "H" again, and the sensor device 1 transitions from the pause state to the operation state. The binary result signal 31 for the first time is "H" at time t=t312, the binary result signal 31 for the second time is "H" at time t=t313, the binary result signal 31 for the third time is "H" at time t=t314, and the binary result signal 31 for the fourth time is "H" at time t=t315. As long as the binary result signal 31 continues to be "H" in this manner, in the sensor device 1, the operation state is continued up to the predetermined maximum number of times.

The binary result signals 31 for the first to fourth times are "H", and thus the determination result signal 61 becomes "H" and is latched by the latch circuit 70 in response to a rising edge of the latch clock signal 53 at time t=t315, so that VOUT becomes a high level (VOUT="H"), that is, the sensor device 1 transitions to the release state indicating that the weak magnetic field Bw is detected, and at the same time, the drive control signal 51 transitions to "L", whereby the sensor device 1 transitions from the operation state to the pause state.

Next, an operation in a case where the applied magnetic flux density B is substantially equal to the threshold, that is, the operation point BOP and the return point BRP will be described. In the present embodiment, the applied magnetic flux density B in a case where a difference between the amplification signal (A*VSIG) and the comparison reference voltage VBOP is a noise level or less is referred to as the applied magnetic flux density B of "substantially equal to the operation point BOP". In addition, the applied magnetic flux density B in a case where a difference between the amplification signal (A*VSIG) and the comparison reference voltage VBRP is the noise level or less is referred to as the applied magnetic flux density B of "substantially equal to the return point BRP".

Figure 4:
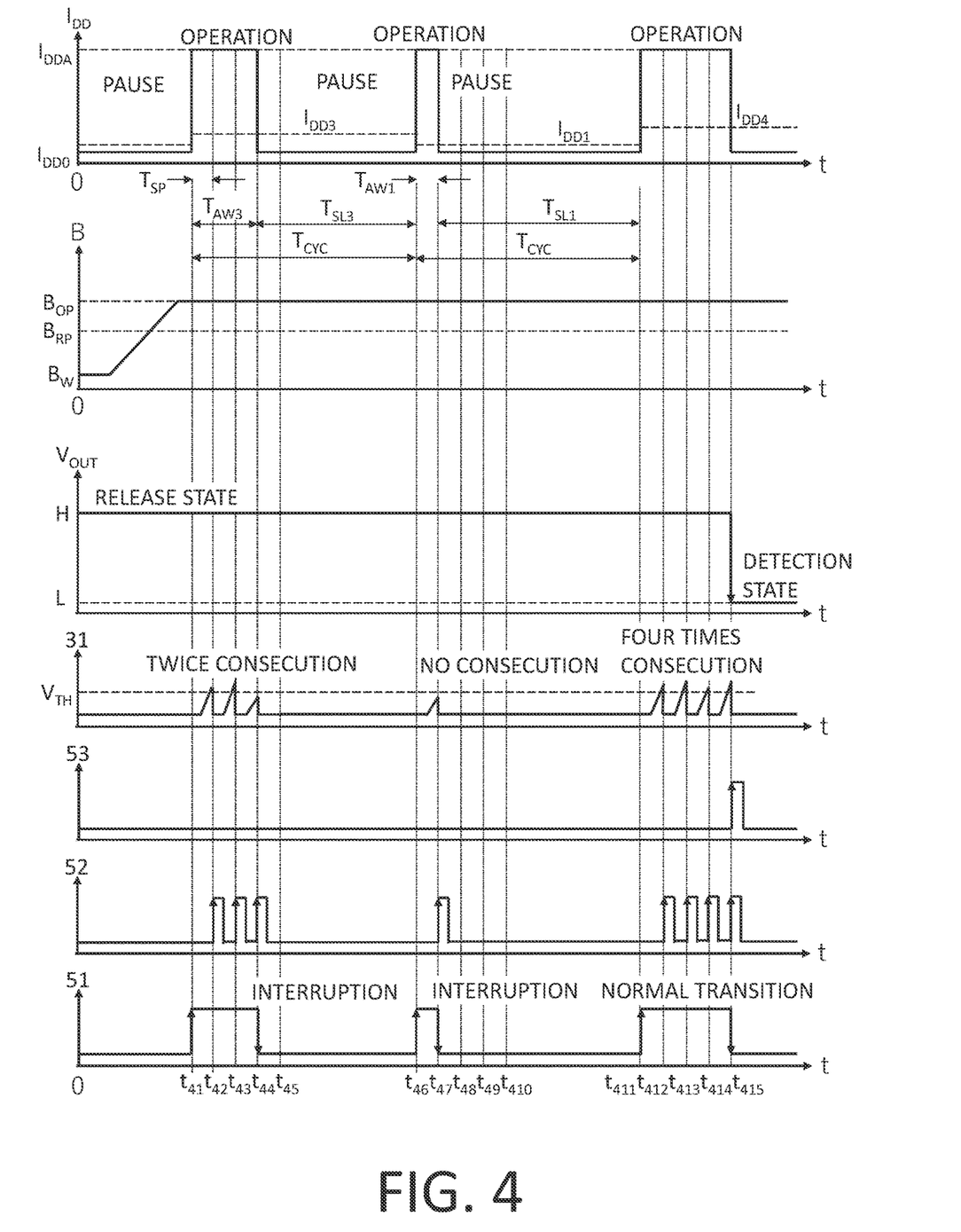
FIG. 4 is a timing chart in a case where an applied magnetic flux density substantially equal to that of an operation point is applied after a weak magnetic field filed is applied in the sensor device according to the embodiment.

FIG. 4 is an operational timing chart in the sensor device 1 in a case where the applied magnetic flux density substantially equal to the operation point is applied after the weak magnetic field is applied.

FIG. 4 is different from FIG. 3 mainly in that the applied magnetic flux density B is not in a state where the applied magnetic flux density B is sufficiently large relative to the operation point BOP which is the threshold (strong magnetic field) or is sufficiently small relative to the return point BRP which is the threshold (weak magnetic field), and is susceptible to noise. In the embodiment of the present invention, an operation in a case where the applied magnetic flux density B substantially equal to the operation point BOP (B≈BOP) is applied after the weak magnetic field (B=Bw) is applied will be described using the drawings.

At time t=0, the drive control signal 51 is "L", and the sensor device 1 is in the pause state. The applied magnetic flux density B is below the return point BRP (B<BRP), and VOUT is a high level (VOUT="H"), that is, a weak magnetic field state holds. The binary result signal 31 is forcibly fixed to a low level, that is, the voltage VCMP is fixed to "L" (VCMP="L") because the sensor device 1 is in the pause period.

At time t=t41, the drive control signal 51 transitions to "H", and the sensor device 1 becomes in the operation state. The applied magnetic flux density B is substantially equal to BOP (B≈BOP), so that the binary result signal 31 randomly exceeds/does not exceed a threshold voltage VTH due to an influence of noise, and may take "H" or "L". The binary result signal 31 for the first time is "H" at time t=t42, the binary result signal 31 for the second time is "H" at time t=t43, the binary result signal 31 for the third time is "L" at time t=t44, and the binary result signal 31 of "L" is output, so that the operation state is not continued up to the predetermined maximum number of times, the drive control signal 51 transitions to "L", and the sensor device 1 interrupts the operation state and transitions to the pause state. At time t=t45, the latch clock signal 53 is not output, and the latch circuit 70 holds the current logic and VOUT is a high level (VOUT="H"), that is, the release state is held.

Subsequently, the pause state is continued until immediately before time t=t46, and the applied magnetic flux density B remains substantially equal to BOP (B≈BOP). At time of t=t46, the drive control signal 51 transitions to "H" again, and the sensor device 1 becomes in the operation state. Here, the binary result signal 31 for the first time is "L", at time t=t47, the drive control signal 51 transitions to "L", and the sensor device 1 immediately transitions to the pause state. For a period from time t=t47 to time t=t410, the sensor device 1 operates as the pause state in which the operation state is discontinued. At time t=t410, the latch clock signal 53 is not output, and the latch circuit 70 holds the current logic and VOUT is a high level (VOUT="H"), that is, the release state is held.

Subsequently, the pause state is continued until immediately before time t=t411, and the applied magnetic flux density B remains substantially equal to BOP (B≈BOP) for a period from time t410 to time t411. At time t=t411, the drive control signal 51 transitions to "H" again, and the sensor device 1 becomes in the operation state. The binary result signal 31 for the first time is "H" at time t=t412, the binary result signal 31 for the second time is "H" at time t=t413, the binary result signal 31 for the third time is "H" at time t=414, and the binary result signal 31 for the fourth time is "H" at time t=t415. As long as the binary result signal 31 continues to be "H" in this manner, the operation state is continued up to the predetermined maximum number of times.

The binary result signals 31 for the first to fourth times are "H", and thus the determination result signal 61 becomes "H" and is latched by the latch circuit 70 in response to a rising edge of the latch clock signal 53 at time t=t415, so that VOUT becomes a low level (VOUT="L"), that is, the sensor device 1 transitions to the detection state, and at the same time, the drive control signal 51 transitions to "L", whereby the sensor device 1 transitions to the pause state.

In this way, in FIG. 4, the operation has been described in which the applied magnetic flux density B is substantially equal to the operation point BOP, and the sensor device 1 becomes in the detection state through a plurality of operation periods due to the influence of noise. This example is an example in which two-time match is obtained in the first operation period, zero-time match is obtained in the second operation period, and four-time match is obtained in the third operation period, whereby the sensor device 1 transitions to the detection state. Noise is randomly generated, and thus a probability of matching n times in the m-th operation period is stochastically determined. As described above, during transition to the detection state through the four-time match, each state of zero-time match (non-detection), one-time match, two-time match, and three-time match is generated with a constant weight for each operation period.

The average consumption currents in a case where the respective states are generated are IDD1 at the time of zero-time match, IDD2 at the time of one-time match, IDD3 at the time of two-time match, and IDD4 at the time of three-time match. Next, a relationship between the applied magnetic flux density B and the consumption current IDD in the magnetic sensor device 1 will be described.

Figure 5A:
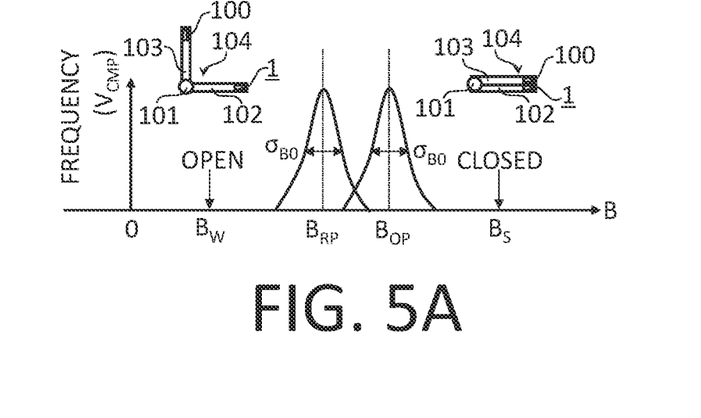
FIG. 5A is a histogram of an occurrence frequency relative to the applied magnetic flux density in the sensor device according to the embodiment.

A difference of the average consumption current IDD relative to the applied magnetic flux density B between the embodiment of the present invention and the conventional technology will be described. FIG. 5A is a histogram of an occurrence frequency relative to the applied magnetic flux density B in the sensor device 1, FIG. 5B is a relationship diagram illustrating a relationship of an average consumption current IDD in the sensor device 1 relative to the applied magnetic flux density B (in a case where a state transitions from "open" to "closed"), and FIG. 5C is a relationship diagram illustrating a relationship of the average consumption current IDD in the sensor device 1 relative to the applied magnetic flux density B (in a case where a state transitions from "closed" to "open").

Figure 5B:
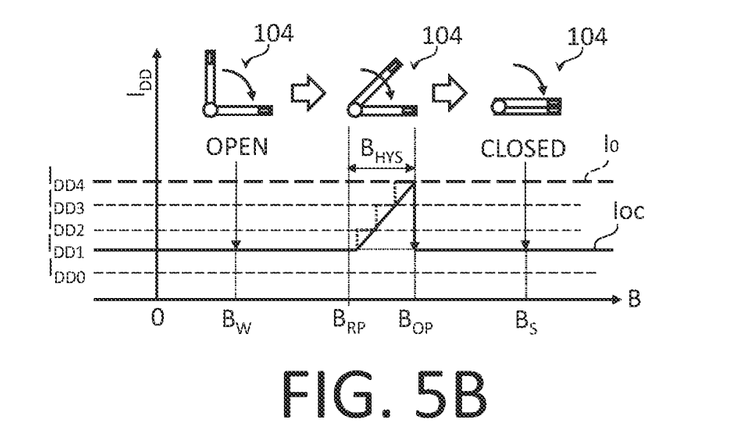
FIG. 5B is a relationship diagram illustrating a relationship of an average consumption current relative to the applied magnetic flux density in the sensor device according to the embodiment (in a case where a state transitions from "open" to "closed").
Figure 5C:
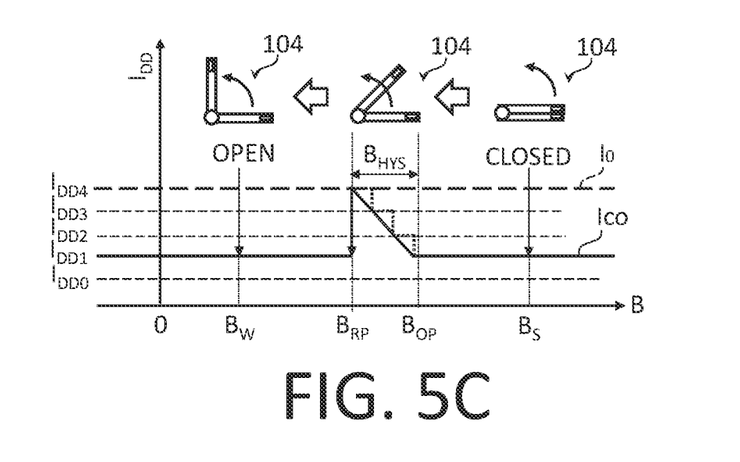
FIG. 5C is a relationship diagram illustrating a relationship of the average consumption current relative to the applied magnetic flux density in the sensor device according to the embodiment (in a case where a state transitions from "closed" to "open").

Note that "I0" illustrated in FIG. 5B and FIG. 5C represents an average consumption current in a sensor device to which a conventional technology is applied (hereinafter simply referred to as a "conventional device").

In FIG. 5A, a region where the applied magnetic flux density B is weaker than the return point BRP (B<BRP) corresponds to a sufficiently "open" position, and a region where the applied magnetic flux density B is stronger than the operation point BOP (B>BOP) corresponds to a sufficiently "closed" position, for example, in an open/close detection mechanism 104 in which a cover 103 to which a magnetic article 100 is attached and a housing 102 in which the sensor device 1 is included are connected to each other by a hinge 101 in an openable/closable manner in the drawing. A middle between the sufficiently "open" position and the sufficiently "closed" position corresponds to a region of BRP<B<BOP.

As illustrated in FIG. 5A, in a situation where the open/close detection mechanism 104 is placed at the sufficiently "open" position or the sufficiently "closed" position, the binary result signal 31 is always "L", and the output logic signal 71 of the sensor device 1 does not change. In addition, the open/close detection mechanism 104 is often at the "open" position or the "closed" position described above during a most period of its operation. At the "open" position or the "closed" position, the operation period is discontinued without exceeding the threshold in the first determination processing, the multi-time determination processing is not executed during the operation period, and the operation period TAW becomes TSP (TAW=TSP), so that the average consumption current becomes IDD1. Due to the influence of noise inherent in the sensor device 1, the operation point BOP and the return point BRP have a fluctuation in the threshold represented by, for example, a standard deviation B. Thus, the operation point BOP and the return point BRP have a finite repetition reproducibility σB, and can be expressed as a histogram of occurrence frequency.

With reference to FIG. 5B, the average consumption current relative to the applied magnetic flux density in a case of state transition from "open" to "closed" will be described. In FIG. 5B, a vertical axis represents the average consumption current. Ioc represents the average consumption current of the sensor device 1 in the case of state transition from "open" to "closed". IDD1 to IDD4 correspond to current values in FIGS. 3 and 4.

In the "open" state where the cover 103 is sufficiently open, the applied magnetic flux density B is sufficiently small, B=Bw<<BOP is satisfied, and the sensor device 1 is in the release state, that is, VOUT is a high level (VOUT="H"). At this time, the processing circuit 30 operates with the magnetoelectric conversion characteristic in FIG. 2C.

In response to gradual closing of the cover 103, the applied magnetic flux density B increases, and eventually becomes BRP (B=BRP). In this stage, nothing is detected in the determination circuit 60, and the average consumption current is IDD1.

In a case where the cover 103 is further closed, the applied magnetic flux density B reaches a left skirt of the histogram of the repetition reproducibility of the operation point BOP illustrated in FIG. 5A. As the cover 103 is further closed and the applied magnetic flux density B gets closer to the state of B=BOP, in the multi-time determination processing in the determination circuit 60, a probability of continuous detection determination increases like single detection, two-time match, and three-time match, and the average consumption current increases from IDD1 and gradually gets close to IDD4.

In a case where the cover 103 is further closed and the applied magnetic flux density B reaches substantially BOP (B≈BOP), four-time match determination is performed in the determination circuit 60, the sensor device 1 becomes the detection state, that is, VOUT becomes a low level (VOUT="L"), the processing circuit 30 is switched to the operation with the magnetoelectric conversion characteristic illustrated in FIG. 2B, and the average consumption current is reduced to IDD1.

Subsequently, the cover 103 is further closed and completely becomes in the "closed" state, and the applied magnetic flux density B is sufficiently large and B=Bs>>BOP is satisfied. In this state, the processing circuit 30 still operates with the magnetoelectric conversion characteristic of FIG. 2B, so that the average consumption current keeps IDD1.

On the other hand, in the conventional device, I0 as the average consumption current does not depend on the open/closed state of the cover, that is, the applied magnetic flux density B, and the multi-time determination processing is performed four times during the operation period, so that the operation period TAW4 is 4TSP (TAW4=4TSP), and the average consumption current (I0) is a constant value of IDD4. This means that the average consumption current is also IDD4 in the "open" position and the "closed" position that occupy the most period during operation. As described above, the sensor device 1 is more advantageous than the conventional device in the low consumption current because the average consumption current can be reduced to IDD1 in the completely "open" position or "closed" position. In other words, the average consumption current (Ioc) of the sensor device 1 in the case of state transition from "open" to "closed" can be reduced to be less than the average consumption current (I0) of the conventional device.

With reference to FIG. 5C, the average consumption current relative to the applied magnetic flux density in the case of state transition from "closed" to "open" will be described. A vertical axis represents the average consumption current. Ico represents the average consumption current of the sensor device 1 in a case of state transition from "closed" to "open". Similarly to FIG. 5B, IDD1 to IDD4 correspond to the current values in FIGS. 3 and 4.

In the "closed" state where the cover 103 is sufficiently closed, the applied magnetic flux density B is sufficiently large, B=Bs>>BOP is satisfied, and the sensor device 1 is in the detection state, that is, VOUT is a low level (VOUT="L"). At this time, the processing circuit 30 operates with the magnetoelectric conversion characteristic in FIG. 2B.

In response to gradual opening of the cover 103, the applied magnetic flux density B decreases, and eventually becomes BOP (B=BOP). In this stage, nothing is detected in the determination circuit 60, and the average consumption current is IDD1.

In a case where the cover 103 is further opened, the applied magnetic flux density B reaches a right skirt of the histogram of the repetition reproducibility of BRP illustrated in FIG. 5A. As the cover 103 is further opened and the applied magnetic flux density B get closer to the state of B=BRP, in the multi-time determination processing in the determination circuit 60, a probability of continuous release determination increases like single release, two-time match, and three-time match, and the average consumption current increases from IDD1 and gradually gets close to IDD4.

In a case where the cover 103 is further opened and the applied magnetic flux density B reaches substantially BRP (B≈BRP), four-time match determination is performed in the determination circuit 60, the sensor device 1 becomes the release state, that is, VOUT becomes a high level (VOUT="H"), the processing circuit 30 is switched to the operation with the magnetoelectric conversion characteristic in FIG. 2C, and the average consumption current is reduced to IDD1.

Subsequently, the cover 103 is further opened and completely becomes in the "open" state, and the applied magnetic flux density B is sufficiently small and satisfies B=Bw<<BRP. In this state, the processing circuit 30 still operates with the magnetoelectric conversion characteristic in FIG. 2C, so that the average consumption current keeps IDD1.

On the other hand, the average consumption current (I0) in the conventional device does not depend on the open/closed state of the cover, that is, the applied magnetic flux density B, and the average consumption current (I0) is a constant value of IDD4. As described above, the average consumption current (Ico) of the sensor device 1 in the case of state transition from "closed" to "open" can be reduced to be less than the average consumption current (I0) of the conventional device.

Next, reproducibility improvement of a switching point and effective reduction of the average consumption current in the sensor device 1 will be described.

Figure 6A:
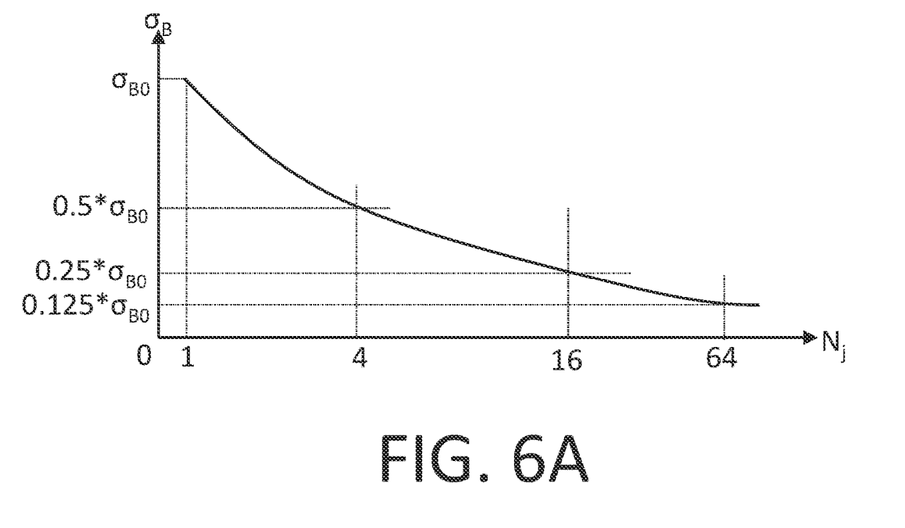
FIG. 6A is a relationship diagram illustrating a relationship of reproducibility of the operation point and a return point relative to the number of times of match determination in the sensor device according to the embodiment.
Figure 6B:
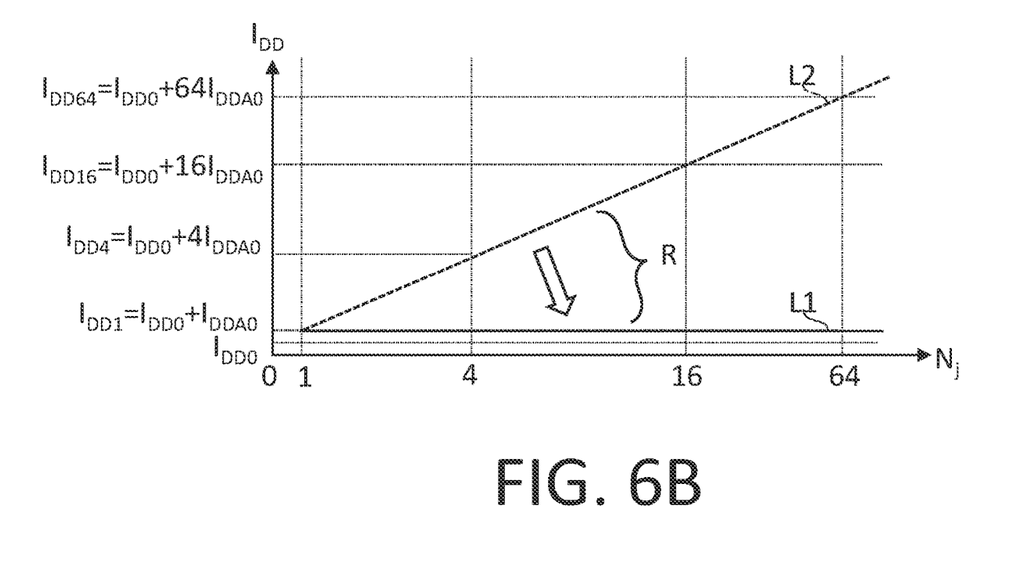
FIG. 6B is a relationship diagram illustrating a relationship of the average consumption current relative to the number of times of match determination in the sensor device according to the embodiment.

FIG. 6A is a relationship diagram illustrating a relationship of the reproducibility σB of the operation point BOP relative to the number of times of match determination Nj in the sensor device 1, and FIG. 6B is a relationship diagram illustrating a relationship of the average consumption current relative to the number of times of match determination Nj in the sensor device 1. Here, the number of times of match determination Nj in FIGS. 6A and 6B is any natural number.

In FIG. 6A, the reproducibility σB of the operation point BOP and the return point BRP based on Nj=1, that is, one-time determination is defined as σB0. The reproducibility σB for any number of times of match determination Nj can be expressed by Equation (4) below, using the number of times of match determination Nj, and the reproducibility σB0 of the operation point BOP and the return point BRP based on one-time determination.

$$\sigma B = \sigma B0/\sqrt{Nj} \quad (4)$$

Here, the reproducibility σB is smaller-the-better, which is ideally zero. From Equation (4) above, it can be seen that in a case where the number of times of match determination Nj is greater, the reproducibility σB becomes smaller and is improved. In addition, in a case where σB0 is zero (σB0=0), σB is always zero (σB=0), the operation point BOP and the return point BRP have no fluctuation, and the repetition reproducibility of the detection/release operation becomes perfect. For example, σB is reduced, like σB is 0.5*σB0 (σB=0.5*σB0) for Nj=4, σB is 0.25*σB0 (σB=0.25*σB0) for Nj=16, and σB is 0.125*σB0 (σB=0.125*σB0) for Nj=64. On the other hand, the greater number of times of match determination Nj increases a circuit scale of the determination circuit 60. For this reason, in setting the number of times of match determination Nj, preferably, at least one of a request specification of the repetition reproducibility of the detection/release operation and an acceptable circuit scale of the determination circuit 60 are appropriately considered.

A solid line L1 illustrated in FIG. 6B indicates a relationship of the average consumption current relative to the number of times of match determination in a case where the applied magnetic flux density B is in a range where the applied magnetic flux density B is sufficiently weak (B<<BRP) or sufficiently strong (B>>BOP) with respect to the operation point BOP and the return point BRP, which are switching points, in the sensor device 1, and a dashed line L2 indicates a relationship (comparative example) of the average consumption current relative to the number of times of match determination Nj in the conventional sensor device.

In the conventional sensor device, the average consumption current IDD increases in proportion to the number of times of match determination Nj regardless of the applied magnetic flux density B, and thus the average consumption current becomes IDDnj. That is, the average consumption current of the conventional sensor device is indicated by the dashed line L2 in FIG. 6B.

On the other hand, in the sensor device 1, the average consumption current changes depending on the applied magnetic flux density B. More specifically, in the applied magnetic flux density B near the switching points (BOP, BRP), which satisfies that the applied magnetic flux density B is substantially equal to at least one of the operation point BOP and the return point BRP (see FIG. 4), the average consumption current becomes IDD1 or greater and less than IDDnj, and in the applied magnetic flux density B (see FIG. 3) which is sufficiently weak (B<<BRP) or sufficiently strong (B>>BOP) with respect to the switching points, the average consumption current becomes IDD1. Thus, in the sensor device 1, the average consumption current can be reduced to equal to or less than the average consumption current (=IDDnj) in the conventional sensor device over the entire range of the applied magnetic flux density B.

In the embodiment of the present invention, it has been described that the average consumption current IDD can be reduced to be sufficiently small under a condition where the applied magnetic flux density B sufficiently weak/strong with respect to the switching points is given, even if the number of times of match determination Nj is set large in accordance with a request specification of the repetition reproducibility of the detection/release operation.

According to the embodiment of the present invention, it is possible to improve the reproducibility of the switching points (the operation point and the return point) by using multi-time comparison determination, as well as to reduce the average consumption current in a period occupying a majority of an energization period of the sensor device in which the detection results of physical amounts do not change, by appropriately interrupting the operation period in intermittent driving on the basis of the detection results of physical amounts, that is, transitioning to the pause state. By applying the embodiment of the present invention, it is possible to provide a sensor device which can promote improvement of energy efficiency for lengthening a battery life of a battery-powered device, leading to realization of a sustainable society.

Note that although in the sensor device 1 described above, an example has been illustrated in which the all-time match determination processing is used for a predetermined multi-time determination processing in the determination circuit 60, the predetermined multi-time determination processing is not limited to the all-time match determination processing. The predetermined multi-time determination processing is an example of a determination processing for improving the reproducibility of the operation point having a large fluctuation in case of only a single determination result. In other words, the predetermined multi-time determination processing is freely selected as long as it is a determination processing which can improve the reproducibility of the operation point having a large fluctuation in a case of only a single determination result, and for example, a multi-time determination processing other than the all-time match determination processing such as a majority determination processing, a predetermined number of times of continuous match determination processing, or a combination thereof may be used. In the case where the predetermined logical determination processing contains the plurality of logical determination processings such as the majority determination processing, the predetermined number of times of continuous match determination processing, and the combination thereof, the sensor device 1 may include a selector 65 (illustrated in FIG. 1) which selects one logical determination processing from the plurality of logical determination processings. In the sensor device 1 includes the selector 65, the determination circuit 60 is configured to perform the one logical determination processing selected by the selector 65.

The sensor device 1 described above is a so-called unipolar detection type magnetic switch device, but may be configured as an omnipolar detection type or a bipolar detection type magnetic switch device. In a case where the sensor device 1 is configured as another detection type magnetic switch device, an appropriate logic circuit only need be added to a later stage of the processing circuit 30 to appropriately control the state transition.

Although in the embodiment described above, the control circuit 50 configured to allow the drive circuit 20 and the processing circuit 30 to be switched between the operation state and the pause state has been described, the control circuit 50 only need be configured to allow at least one of the drive circuit 20 or the processing circuit 30 to be switched between the operation state and the pause state.

In the embodiment described above, an example has been described in which the sensor device 1 is configured as a magnetic switch having the Hall element 10 as a sensor element, but the sensor element is not limited to the Hall element. The sensor element may include, for example, a magnetic sensor element other than a Hall element such as a magnetic resistance (MR) element, a magnetic impedance (MI) element, or a flux-gated sensor. In addition, a sensor element is not limited to the sensor element which detects magnetism, and, a sensor element which detects at least one physical amount of, for example, temperature, humidity, pressure, infrared intensity, ultraviolet intensity, visible light intensity, and the like may be applied.

The above-described embodiments and their modifications are included in the scope and gist of the invention, and are also included in the scope of the invention and its equivalents described in the appended claims.

What is claimed is:

1. A sensor device comprising:
a sensor element configured to convert a predetermined physical amount into an electrical signal;
a drive circuit configured to supply a drive signal to the sensor element;
a processing circuit configured to output a binary result signal obtained by binarizing the electrical signal output from the sensor element;
a determination circuit configured to capture the binary result signal a plurality of times and perform a predetermined logical determination processing;
a latch circuit configured to capture a binary output signal from the determination circuit; and
a control circuit configured to output a first control signal for intermittently controlling at least one of the drive circuit and the processing circuit such that an operation period in which an operation current is supplied and a pause period in which the operation current is blocked are repeated with a predetermined cycle, and to output a second control signal in accordance with a logical value of a signal output from the latch circuit, the second control signal for interrupting the operation period and causing the operation period to transition to the pause period in a case where the predetermined logical determination processing is performed in the operation period and an output logic of the determination circuit is determined to be not switched halfway through the operation period,
wherein the determination circuit is configured to perform the predetermined logical determination processing containing a majority determination processing of matching in equal to or more than half of the plurality of times.

2. The sensor device according to claim 1,
wherein the determination circuit is configured to perform the predetermined logical determination processing containing an all-time match determination processing of matching in all times of the plurality of times.

3. The sensor device according to claim 1,
wherein the majority determination processing is a processing of further determining that two or more predetermined continuous times of matching is included in the equal to or more than half of the plurality of times.

4. The sensor device according to claim 1, wherein the sensor element is a magnetic sensor element.

5. The sensor device according to claim 4, wherein the magnetic sensor element is a Hall element.

6. The sensor device according to claim 1, further comprising a selector which selects one logical determination processing from a plurality of logical determination processings,
wherein the predetermined logical determination processing contains the plurality of logical determination processings, and
wherein the determination circuit is configured to perform the one logical determination processing selected by the selector.

* * * * *